United States Patent [19]

Cornette et al.

[11] 4,356,056

[45] Oct. 26, 1982

[54] PROCESS FOR INSULATING THE INTERCONNECTIONS OF INTEGRATED CIRCUITS

[75] Inventors: André Cornette; Georges Rey, both of Paris, France

[73] Assignee: Thomson-CSF, Paris, France

[21] Appl. No.: 235,707

[22] Filed: Feb. 18, 1981

[30] Foreign Application Priority Data

Feb. 22, 1980 [FR] France ............................. 80 03974

[51] Int. Cl.³ ................ H01L 21/306; H01L 21/312; C23F 1/02
[52] U.S. Cl. ..................................... 156/649; 29/580; 156/643; 156/651; 156/659.1; 156/661.1; 204/192 EC; 357/56; 427/93
[58] Field of Search ........ 204/192 D, 192 EC, 192 S, 204/32 S; 156/637, 645, 643, 647, 650, 649, 651, 655, 656, 657, 659.1, 662, 661.1; 427/93, 95; 29/580; 357/56

[56] References Cited

U.S. PATENT DOCUMENTS

| | | | |
|---|---|---|---|
| 3,669,773 | 6/1972 | Levi | 156/649 |
| 3,923,975 | 12/1975 | Calviello | 156/649 X |
| 4,028,140 | 6/1977 | Summers et al. | 156/649 X |
| 4,162,203 | 7/1979 | Eden et al. | 204/192 D |

Primary Examiner—William A. Powell

[57] ABSTRACT

The invention relates to integrated circuits in which each component is formed in an active layer, supported by an island, called mesa, of the substrate.

With a view to forming a dielectric layer on the surface of the substrate and on the sides of the mesas, the components are protected by means of a metal layer, then the mesas are hollowed out with slight underetching under the metal layer. The dielectric is deposited on the whole of the surface of the circuit, by cathode spraying, which allows the part of the metal layer to be spared in its underetched periphery. Chemical attack, from the underetching, eliminates the metal layer and the dielectric which it supports.

10 Claims, 9 Drawing Figures

PRIOR ART FIG.1
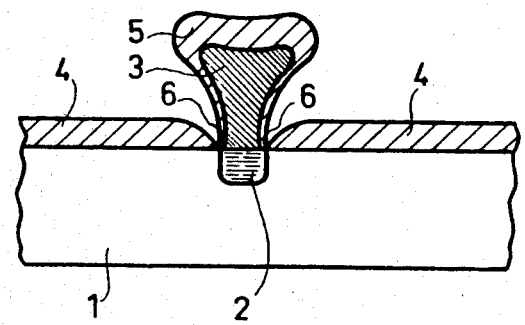
FIG.2
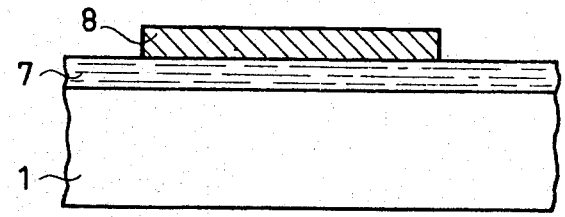
FIG.3
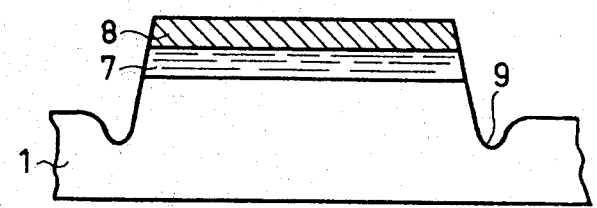

PROCESS FOR INSULATING THE INTERCONNECTIONS OF INTEGRATED CIRCUITS

BACKGROUND OF THE INVENTION

The invention relates to a process for insulating the interconnections of integrated circuits whose active components form raised islands called mesas on the surface of the substrate. The present invention applies more particularly to rapid integrated circuits formed on semiconducting materials of type III-V and II-VI ... etc., i.e. those which are of types GaAs, Al Ga As, ... . In fact, in these integrated circuits, an active layer is formed on a semi-insulating substrate, and each component formed on a mesa which is in the form of an island raised with respect to the substrate which forms the mechanical support for the integrated circuit. This structure originates from the fact that it is not possible to form "planar" structures with the techniques known at present.

In the most usual case of GaAs or its derivatives, the arsenic migrates and volatilizes at high temperatures, greater than 800° C. Now, the diffusion of an insulating "caisson" about a planar transistor for example passes through a high-temperature step, and the ionic implantation destroys the surface crystalline network which must then be reorganized by reheating, also at high temperature. This is why, in the present state of the techniques, integrated circuits of types III-V, II-VI are formed by mesa techniques. The formation of these mesas, i.e. an island for each of the components, presents great difficulties associated with the extremely small dimensions of the islands in question which are of the order of a micrometer.

The invention also applies to silicon semiconductors, but then it is especially advantageous in the case of discrete components having a mesa structure of the power transistor, thyristor, triac type ... etc. which require passivation on their contours, because of the leakage electric field. To form insulating or passivated structures, the known method consists in:

depositing an insulating layer on the free surface of the semiconductor chip—by free surface of the chip is meantant the one which is not soldered to the base of the sealing case;

to deposit then a photosensitive resin on the surface of the semiconductor being manufactured;

to subject the resin to the action of photons or electrons through a mask which defines the resin portions which must be removed subsequently;

finally to remove the insulation where it should not remain, for example on the surface of the active components, by a chemical etching process which depends on the nature of the resin used according as to whether it is positive or negative.

This known process which has just been very rapidly described is in fact suitable for semiconductors whose dimensions are of the order of a millimeter, such for example as discrete or power-transistor chips. This technology does not allow very rapid integrated circuits to be formed, such as those formed on gallium arsenide or its derivatives. The difference resides essentially in the dimensions of the insulators to be formed. Substrates of the gallium arsenide type are used for constructing very rapid circuits whose active elements, such as transistors, field-effect transistors, MOS, are of very small sizes, of the order of a micron as has been mentioned: therefore, forming a passivation about a mesa cannot use known technologies for the wavelength of visible or even ultraviolet light and the accuracy of the masks obtained is no longer sufficient for perfectly delimiting the protected or insulated zones.

Moreover, providing passivation on a discrete semiconductor or a conventional silicon integrated circuit, requires at least one additional mask: provision of the insulation of the mesas in accordance with the invention only uses a single mask which already exists since it has already served during manufacture for defining a step in the construction of the integrated circuit. It is then a process which, all things considered, requires no additional mask.

For constructing high-integration-density or very-high-speed integrated circuits, use is no longer made of a photographic masking process but of an electronic masker and electrosensitive resins, preferably positive. Electronic masking provides the desired accuracy but its rational use requires only the least possible resin being exposed to the beams of the masker so as to operate more rapidly. Positive resins allow lines to be obtained whose width is less than a micron, by a technique for depositing on resin currently called by the term "lift-off", which technique will be described subsequently in detail so as to facilitate understanding of the invention.

SUMMARY OF THE INVENTION

The process of the invention requires then no masks other than those existing for forming the semiconductor. According to this process, the semiconductor is in a first stage protected on the surface by a metal layer, then a mesa groove is formed thereabout either by mechanical machining by means of ionic bombardment or by a chemical process. An important step in the process of the invention consists in effecting a slight underetching with respect to the metal cover which protects the component, underetching both of the active layer and of the substrate: this operation will allow the metal cover to be subsequently chemically attacked so as to loosen and free the component at the end of the manufacturing process. Finally, the whole of the chip is covered with a low-temperature dielectric and the active component which is then "hidden" under a metal cover itself coated with a dielectric layer is released by chemical attack. At the end of these operations, there remains then a component insulated on a mesa and surrounded by a dielectric layer which covers the substrate over all parts situated between the mesas at the surface of the integrated circuit.

More precisely, the invention is formed by a process for insulating the interconnections of integrated circuits, whose components are formed in an active layer, on islands designated "mesa", raised up with respect to the substrate which supports the active layer, characterized in that, for each component, it comprises the following succession of operations:

the component is protected over its free surface by means of a metallic deposit, formed by one or more layers of metals of different nature, and delimited by photolithography or by the method of depositing on resin;

the mesa is hollowed out about the component, by ionic machining;

the substrate and the active layer, under the metal deposit, are chemically attacked on the periphery of the mesa, so as to create an underetching of the metal deposit;

a dielectric is deposited, by low-temperature cathode spraying, over the whole of the circuit, the lower periphery of the metal deposit, underetched during the preceding operation, being spared by this spraying method;

the dielectric deposit and the metal deposit which coat each component are eliminated by chemical attack of the metal, said attack beginning by the periphery of the metal deposit, which has been laid bare, whereas the dielectric deposit on the substrate remains and protects the sides of the mesa.

DESCRIPTION OF THE DRAWINGS

The invention will be better understood from the description which will be made thereof, which refers to the figures which represent:

FIG. 1: the process for depositing on resin, or "lift-off";

FIGS. 2 to 6: the different steps of the process according to a first embodiment;

DESCRIPTION OF THE PREFERRED EMBODIMENTS

Figure 4:
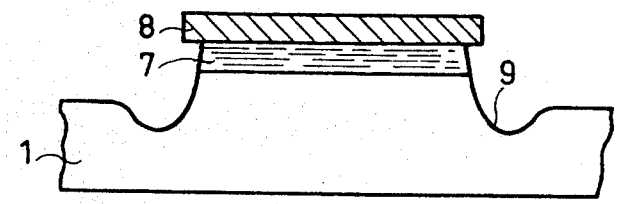

Before describing the invention, a reminder of the method for depositing dielectric on resin, currently called "lift-off", will allow the different phases of the invention to be better understood.

FIG. 1 shows, seen in section, a substrate 1 in or on which an operation is to be carried out in a very small region 2. This operation may be diffusion in the thickness of the substrate, or may also be a metalization or insulation deposit on the surface of region 2 of the substrate. The "lift-off" process comprises first of all depositing a layer of resin over the whole of the substrate, then this resin is etched by photomasking and dissolution so that there only remains a mushroom-shaped part 3 which is located straight above region 2 on which it is desired to carry out an operation. In actual fact, the dissolution of the resin results in the resin plug which remains above region 2 not being a parallelepiped, which is slightly dissolved on its sides giving it the appearance of a mushroom. When the different plugs 3 have been reserved, the whole of the substrate is coated with dielectric layers, layer 4 for the substrate and 5 for the resin mushroom. To free region 3, the resin mushroom is then subjected to the combined action of a solvent which dissolves the resin and an ultrasonic treatment which breaks the dielectric film 6 at the foot of mushroom 3, which film grows thinner and thinner and which is for this reason extremely fragile and permeable. Thus, when the resin mushroom 3 has been dissolved and its dielectric envelope broken, there only remains on the surface of substrate 1 extremely small but very precise traces which correspond to the operations which it is desired to carry out in region 2.

The "lift-off" process is used during the process of the invention as will be described in the following figure.

FIG. 2 shows, seen in section, a semi-insulating substrate 1 on which has been formed a conducting or semiconducting layer 7 of a type corresponding to components or integrated circuits which are to be formed on the surface of substrate 1. A metal cover 8 deposited by vacuum metalization then etching, on layer 7, the delimitation of each cover 8 corresponding to each of the components or to each of the component parts of the integrated circuit being formed on substrate 1. By way of indication, metal layer 8 has a thickness of 800 nanometers and it is formed by an aluminium deposit delimited by photolithography or "lift-off".

FIG. 3 shows the second step of the process. The mesa on which the component of layer 7 is to be insulated is machined by mechanical erosion by an ionic machiner, called in English "ion milling", which subjects the active layer and the layer of the substrate to bombardment by argon ions and by electrons. It is known that during this mechanical machining by atoms, the sides of the mesa have a slight slope and the mesa is surrounded at its base by the equivalent of a ditch 9.

FIG. 4 shows the result obtained during the following step by underetching of the semi-insulating or semmiconductor support under the aluminium cover. This underetching is obtained by chemical erosion, from a solution comprising, insofar as attack by gallium arsenide is concerned, one part of phosphoric acid $PO_4H_3$, one part of oxygenated water $H_2O_2$ and 998 parts of water $H_2O$.

The whole of the steps of FIG. 3 and FIG. 4 may also be replaced by a single step for etching the mesa—equivalent to what is shown in FIG. 3—and for underetching the mesa—equivalent to what is shown in FIG. 4—by a single erosion operation by a chemical process.

In this case, the mesa is not surrounded by a ditch 9 but decreases slowly to the surface of the substrate which remains after chemical etching.

Figure 5:
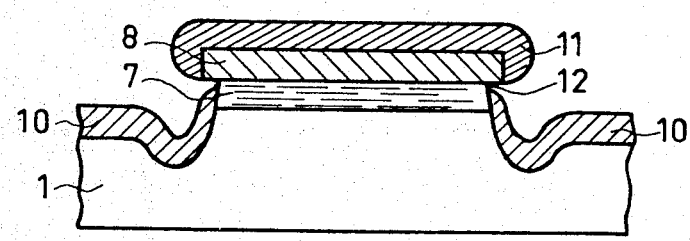

FIG. 5 shows that the whole of the substrate, which comprises henceforth a number of mesas each coated with an aluminium cover 8, is subjected to low-temperature depositing of dielectric over the whole of its surface. The depositing of silicon dioxide $SiO_2$ for example takes place by cathode spraying and has a thickness of the order of 200 to 400 nanometers. The result obtained is then constituted by a dielectric layer 10 which is deposited on substrate 1 about the mesas and which rises along the sides of the mesas; it is also formed by a layer 11 which coats the aluminium cover 8 on each mesa.

The operation for underetching the mesa under the aluminium cover finds its justification in that it is part 12 of the aluminium which extends slightly beyond the plateau of the mesa which will enable the periphery of this aluminium cover to be attacked chemically so as to free the mesa therefrom.

Figure 6:
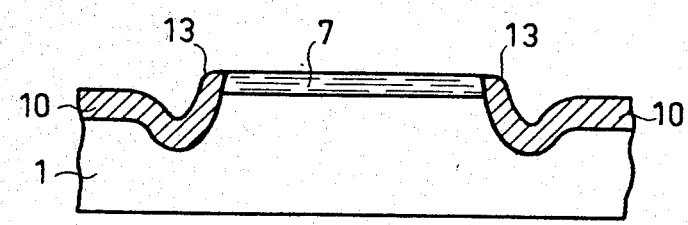

FIG. 6 shows the result obtained at the end of the operations. On a semi-insulating substrate 1 is situated a wafer of a seiconducting material 7 which is isolated by a mesa, whose sides are also protected by a dielectric layer 13, whereas this same layer covers the semi-insulating substrate 10, the aluminium and the dielectric 11 which were above the mesa have disappeared by chemical attack.

In the embodiment of the invention such as described, it should be noted that on the sides of the mesa the dielectric layer is flush at 13 with the upper face of the mesa. This is favorable to the operation for example of field-effect transistors. However, the case where this dielectric layer slightly covers the edges of the upper face of the mesa, forming as it were a wave deposited on the periphery of component 7, may be favorable for some components such as diodes.

A variation of the process of the invention allows this wave-covering form to be obtained. Only the subsequent steps thereof are shown in the following three figures.

Figure 7:
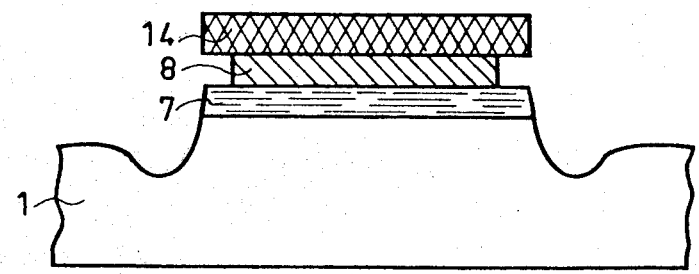
FIGS. 7 to 9: the final steps of the process of the invention, according to another embodiment.

FIG. 7 corresponds to FIG. 4 of the first embodiment of the invention, but it should be noted that active layer 7 has been covered first of all with a first aluminium layer 8 then a second layer 14 of chromium. After the mesa has been machined, the aluminium is subjected to slight underetching by a chemical process: thus there is created between active layer 7 and chromium layer 14 recession of the aluminium whose dimensions are restricted following the chemical attack.

Figure 8:
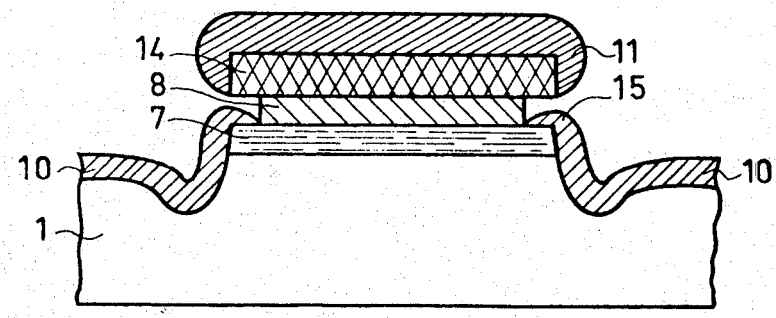

FIG. 8, which corresponds to FIG. 5 of the first embodiment, shows that when the substrate wafer is subjected to low-temperature deposition of a dielectric, by cathode spraying, the dielectric penetrates between active layer 7 and chromium layer 14 and forms this slightly enveloping wave 15 which has been discussed.

Figure 9:
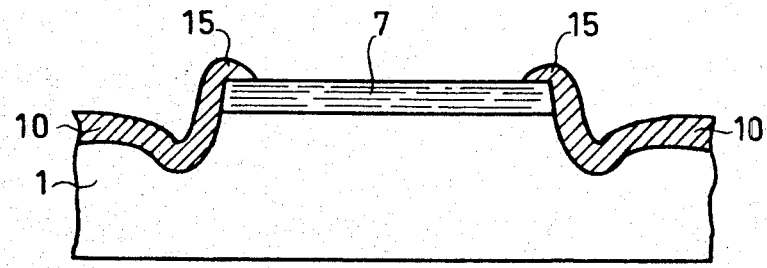

FIG. 9 shows the mesa at the end of manufacture, when the triple cover of aluminium, chromium and dielectric has been removed by chemical attack. The active component 7 is protected over the whole of its periphery by the dielectric which forms an enveloping wave at 15; the following steps for manufacturing the integrated circuit or the diode then take place by means of known processes such as contact layer, metalization deposits, etc.

The invention has been described with reference, for the sake of clarity, to the example of an integrated circuit formed on gallium arsenide; however, it will be readily understood that this process for depositing a dielectric on the surface of a substrate applies much more generally to all semiconductors on different types of semiconductor substrates whose dimensions justify use of the "lift-off" process rather than of the conventional process which is applied to semiconductors of larger dimensions. By way of example, a rapid integrated circuit on gallium arsenide may comprise about 75 to 80 mesas whose dimensions vary according to the component protected between 1.5 and 2 or 3 microns along one side.

The present invention is not limited to the embodiments which have been more explicitly described above; it includes the different variations and generalizations thereof included within the scope of the following claims.

What is claimed is:

1. A process for insulating the interconnections of integrated circuits having components formed in an active layer raised on mesa-like islands on a substrate supporting the same comprising the following succession of steps:
   (a) applying to the substrate a semi-conducting layer of the desired component material;
   (b) depositing on said layer at least one metal to form a protective layer over the region of said component; said metal deposit being photo-lithographically defined;
   (c) undercutting said metal and semiconducting layers about the component to form a mesa;
   (d) chemically treating the substrate and the semiconducting layer under the metal layer to attack the periphery of the mesa, and underetch the metal layer;
   (e) depositing a dielectric layer, by low-temperature cathode spraying, over the metal layer and substrate but without spraying the lower periphery of the metal deposit underetched during the preceding step, thereby leaving the same exposed; and
   (f) chemically treating the dielectric layer and the metal layer which cover each component to eliminate the same by chemical attack of the metal, said attack beginning at the exposed lower periphery of the metal layer, the dielectric deposit on the substrate being unattacked, whereby to protect the sides of the mesa carrying the semiconducting layer.

2. The insulating process as claimed in claim 1, wherein the metal layer is aluminium.

3. The insulating process as claimed in claim 1, wherein the metal layer is aluminium covered by a chromium layer.

4. The insulating process as claimed in claim 1, wherein the metal layer comprises an aluminium layer covered with a chromium layer, and wherein, after step (e) the aluminium layer is further underetched, under the chromium layer, by chemical attack.

5. The insulating process as claimed in any one of claims 1 to 4, wherein the chemical underetching solution comprises one part of orthophosphoric acid ($PO_4H_3$), one part of oxygenated water ($H_2O_2$) and 998 parts of water by volume.

6. The insulating process as claimed in any one of claims 1 to 4, wherein, in step (f) the dielectric deposit and the metal deposit which cover each component are eliminated by the combined action of a 36-40% hydrochloric acid solution and ultrasonic means.

7. The insulating process as claimed in claim 1, wherein the dielectric covers the substrate and the sides of the mesa, and is flush with the free surface of the mesa without covering it.

8. The insulating process as claimed in claim 4, wherein the dielectric covers the substrate and the sides of the mesa, and partially covers the free surface of the mesa, around its periphery.

9. The insulating process as claimed in claim 1, wherein the mesa about the component is undercut by ionic machining.

10. The insulating process as claimed in claim 1, wherein the mesa about the component is undercut by chemical treatment.

* * * * *